(12) United States Patent
Brodsky et al.

(10) Patent No.: US 6,979,782 B1
(45) Date of Patent: Dec. 27, 2005

(54) APPARATUS AND METHOD FOR MECHANICAL COUPLING OF LAND GRID ARRAY APPLICATIONS

(75) Inventors: William L. Brodsky, Binghamton, NY (US); David L. Questad, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/908,353

(22) Filed: May 9, 2005

(51) Int. Cl.[7] .............................................. H01L 23/02
(52) U.S. Cl. ..................................... 174/52.4; 257/704
(58) Field of Search .......................... 174/52.2, 52.4; 257/704

(56) References Cited

U.S. PATENT DOCUMENTS

| | | | |
|---|---|---|---|
| 5,305,185 A | | 4/1994 | Samarov et al. |
| 5,420,460 A | * | 5/1995 | Massingill ................. 257/693 |
| 5,528,462 A | * | 6/1996 | Pendse ...................... 361/767 |
| 5,760,465 A | * | 6/1998 | Alcoe et al. ............... 257/669 |
| 5,844,168 A | * | 12/1998 | Schueller et al. .......... 174/52.4 |
| 5,949,137 A | * | 9/1999 | Domadia et al. .......... 257/712 |
| 5,958,556 A | | 9/1999 | McCutcheon |
| 6,046,077 A | * | 4/2000 | Baba ......................... 438/127 |
| 6,224,392 B1 | | 5/2001 | Fasano et al. |
| 6,259,154 B1 | * | 7/2001 | Niwa ......................... 257/678 |
| 6,482,496 B1 | | 11/2002 | Wycech |
| 6,703,560 B2 | | 3/2004 | Coico et al. |
| 6,757,965 B2 | | 7/2004 | Colbert et al. |
| 2001/0009197 A1 | * | 7/2001 | Carden et al. ............. 174/52.4 |
| 2004/0188135 A1 | | 9/2004 | Brodsky et al. |

* cited by examiner

*Primary Examiner*—Hung V. Ngo
(74) *Attorney, Agent, or Firm*—James Cioffi; Cantor Colburn LLP

(57) ABSTRACT

A land grid array (LGA) assembly includes a chip carrier substrate having at least one chip attached thereto, and a stiffener member attached to the chip carrier substrate, the stiffener member further including a honeycomb material. A cap is attached to the chip and stiffener member.

19 Claims, 6 Drawing Sheets

108

108

APPARATUS AND METHOD FOR MECHANICAL COUPLING OF LAND GRID ARRAY APPLICATIONS

BACKGROUND

The present invention relates generally to integrated circuit devices and packaging methods, and, more particularly, to an apparatus and method for mechanical coupling of land grid array (LGA) applications.

Area array socket connectors are an evolving technology in which an electrical interconnection between mating surfaces is provided through a conductive interposer. One significant application of this technology is the socketing of land grid array (LGA) modules directly to a printed wiring board, in which the electrical connection is achieved by aligning the contact array of the two mating surfaces and the interposer, then mechanically compressing the interposer. LGA socket assemblies are prevalent today in the electronics industry, and are commonly used to attach single chip modules (SCMs) to printed wiring boards. However, the demand for higher performance is driving the requirement to develop LGA socket assemblies for multi-chip modules (MCMs).

One of the problems confronting the design of multi-chip module socket assemblies is developing a mechanical system to generate the large force required to compress the increased contact area of the interposer without interfering with the heat transfer system of the module, distorting the printed wiring board, or occupying a significant portion of the volume of the enclosure in which the module is housed. A system has thus been devised to solve this problem utilizing one or more load posts attached to the module. The load posts pass though the printed wiring board and a mechanical system incorporating a stiffening plate to reduce printed wiring board distortion is then employed to exert a large tensile force on the load posts pulling the module toward the printed wiring board and compressing the interposer. Since the mechanical system used to compress the interposer is on the side of the printed wiring board opposite the module, it may not occupy any volume of the enclosure nor interfere with heat transfer. One drawback of this system is that if the printed wiring board is mounted vertically, it is very difficult for one person to actuate the connection system on the opposite side of the printed wiring board while holding the multi-chip module in place.

Moreover, there is at present no existing mechanical coupling solution for an organic, LGA configured package. Generally, the interconnect chosen for organic packaging is of the column or ball grid array type, for example, since more is known about the static forces associated therewith. As indicated above, LGA packages create complex stresses on the carrier (via the chip) due to the force per I/O of the retention hardware. This force must be great enough to both compress the LGA springs adequately and to provide stable electrical contacts. Unfortunately, an organic carrier experiences strain and possible failed signal lines (i.e., an electrical reliability impact) under LGA loading. In addition, the stress created on the chip (depending on the stress field) can also negatively affect the low-k and ultra low-k materials and associated BEOL structure of the semiconductor device.

LGA contacts generally apply a force-per-contact to the substrate in a direction that is perpendicular (i.e., normal) to the X-Y plane of the carrier. This normal force may be in the range of about 65 to 85 grams per contact or more, depending on the type of contact used, the substrate co-planarity, and the actuation system tolerances. Attempts to lower this contact force have heretofore been limited by contact stability, reliability concerns and mass isolation effects, among others. LGA contacts tested to date have generally exhibited electrical stability around 28 to 30 grams of normal force per contact. Using a minimum contact normal force of 30 grams, and accounting for tolerance and mass isolation effects, has resulted the nominal force to be in the 65 to 85 gram range.

In view of the above, it would be desirable to be able to provide a low-mass method of securing and supporting an organic laminate top surface to a heat sink device, thereby completing the load application path from the heat sink in an LGA contact system.

SUMMARY

The foregoing discussed drawbacks and deficiencies of the prior art are overcome or alleviated by a land grid array (LGA) assembly. In an exemplary embodiment, the LGA assembly includes a chip carrier substrate having at least one chip attached thereto, and a stiffener member attached to the chip carrier substrate, the stiffener member further including a honeycomb material. A cap is attached to the chip and stiffener member.

In another embodiment, a method for assembling a land grid array (LGA) module includes applying a first adhesive material to a chip carrier substrate having at least one chip attached thereto. A stiffener member is attached to the chip carrier substrate, the stiffener member further including a honeycomb material. A second adhesive material is applied to a cap, and the cap is compressively attached to the chip and the stiffener member.

BRIEF DESCRIPTION OF THE DRAWINGS

Referring to the exemplary drawings wherein like elements are numbered alike in the several Figures.

DETAILED DESCRIPTION

Disclosed herein is an apparatus and method for mechanical coupling of LGA applications and, in an exemplary embodiment, for mechanical coupling of organic based LGA applications in which the stress on a chip due to the LGA retention force is reduced. A general approach herein is to couple the force on the chip lid directly and evenly to the chip carrier so as to allow the force vectors to cancel one another, thus resulting in no net deformation of the carrier. Since this LGA contact normal is applied perpendicular to a laminate bottom surface, it is thus resisted by an equal and opposite force, applied to the top surface of the module assembly. If the force is applied only to the chip top, then the laminate becomes unsupported and stressed.

Honeycomb materials have the unique properties of having high stiffness in the z (out of plane) direction, but are compliant in the in-plane and shear directions, as well as having a low component mass. Used as a stiffener, then, a honeycomb material may be used to connect a chip lid to a substrate (chip carrier) such that the vertical coupling between the lid and substrate will be high, while the shear coupling between the lid and substrate will be low. This permits the support of high LGA loads with minimum strains to the package. At the same time, the lid and substrate are relatively uncoupled in shear, thereby minimizing strains due to thermal cycling.

Figure 1:
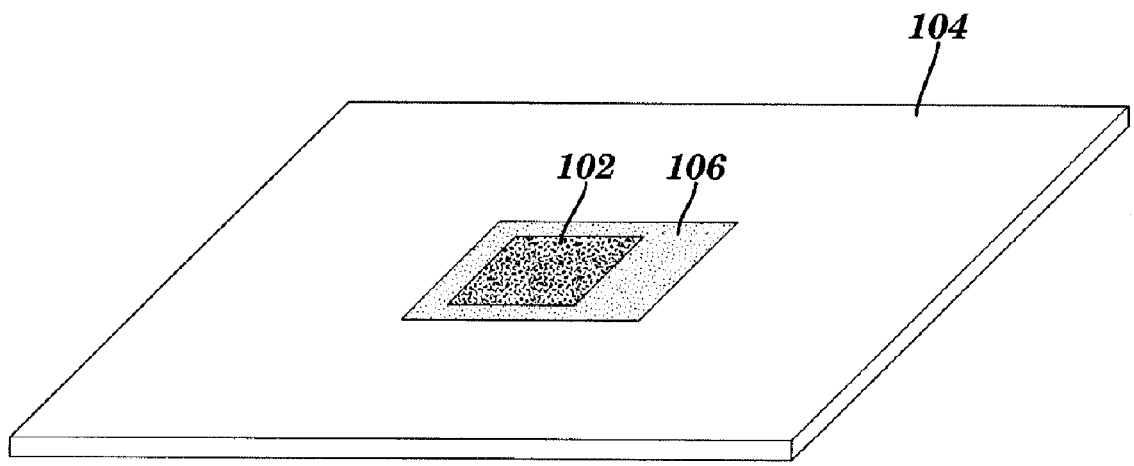
FIG. 1 is a perspective view of a single chip attached to an organic substrate (chip carrier), with an underfill material therebetween.
Figure 2:
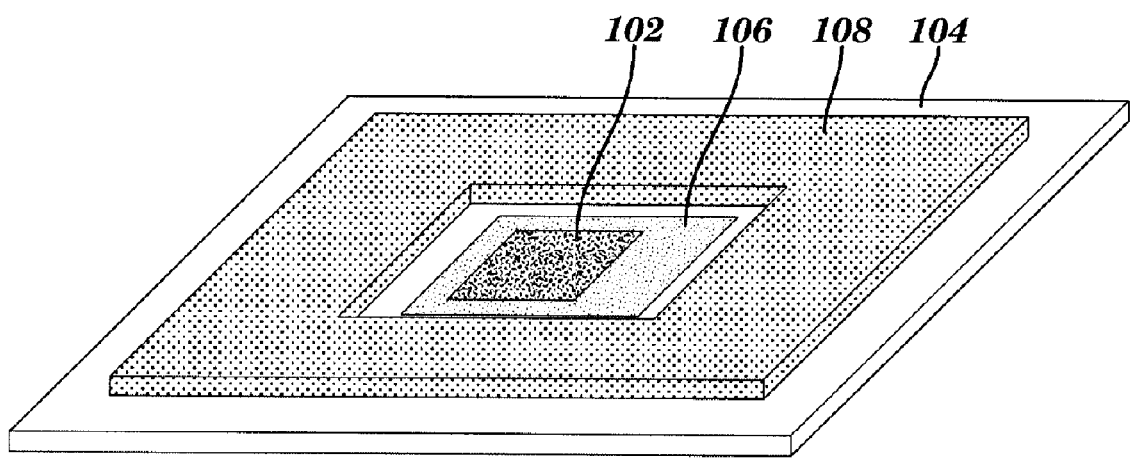
FIG. 2 is a perspective view of the organic chip carrier of FIG. 1, including a honeycomb stiffener material surrounding the attached chip, in accordance with an embodiment of the invention.
Figure 3:
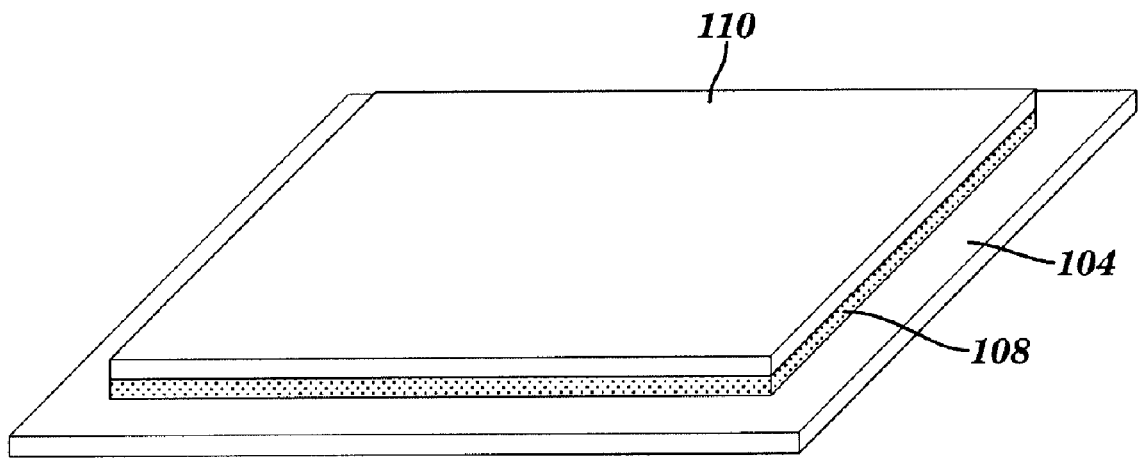
FIG. 3 is a perspective view of the organic chip carrier, chip and stiffener material of FIG. 2, following the subsequent attachment of a chip lid/cap bonded to the stiffener material and chip.

Referring initially to FIGS. 1 and 2, there is shown a perspective view of a single chip 102 attached to an organic substrate 104 (chip carrier), with an underfill material 106 (e.g., epoxy) therebetween. As particularly shown in FIG. 2, an embodiment of the present invention utilizes a honeycomb stiffener 108 attached to the substrate 104 and positioned around the perimeter of the chip 102. Thus, when a lid (cap) 110 is subsequently attached to both the top of the chip 102 and stiffener 108, as shown in FIG. 3, the vertical coupling between the lid 110 and substrate 104 is high, while the shear coupling therebetween is low.

Figure 4:
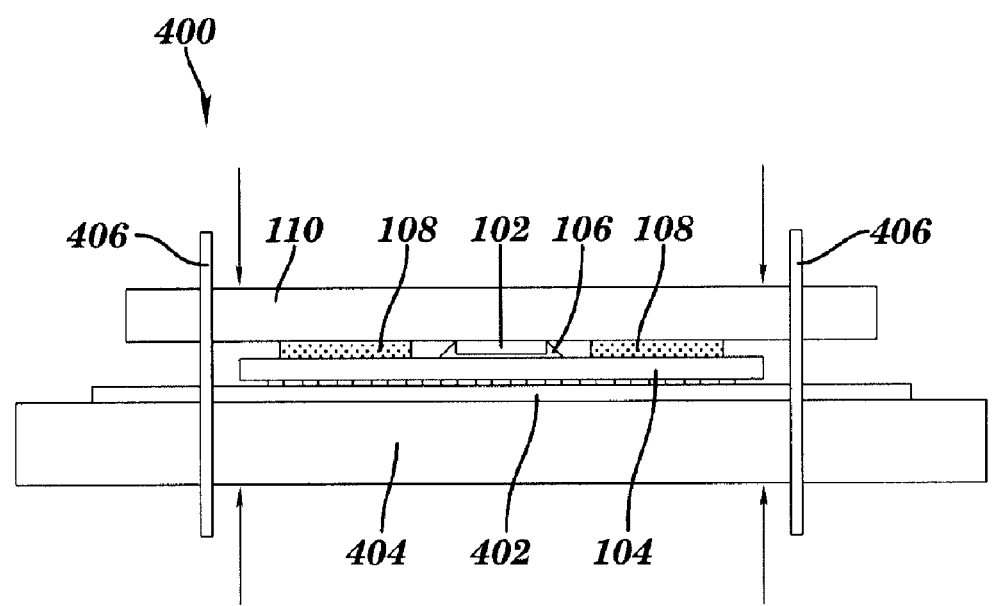
FIG. 4 is a cross sectional view of an organic, land grid array (LGA) module, using a honeycomb stiffener material, in accordance with a further embodiment of the invention.

FIG. 4 is a cross sectional view that particularly illustrates the applicability of the honeycomb stiffener 108 in conjunction with an organic, land grid array (LGA) module 400. As is shown, the organic substrate 104 is itself LGA-attached to a circuit card 402 mounted to a backplate 404. Engagement posts 406 are configured with engagement springs (not shown) to provide an appropriate LGA loading force to the module assembly 400. Because of the presence of the honeycomb stiffener 108, the lid 110 and the organic substrate 104 may expand or shrink more independently with respect to one another than would be the case for a single, solid interposer material.

Figure 5:
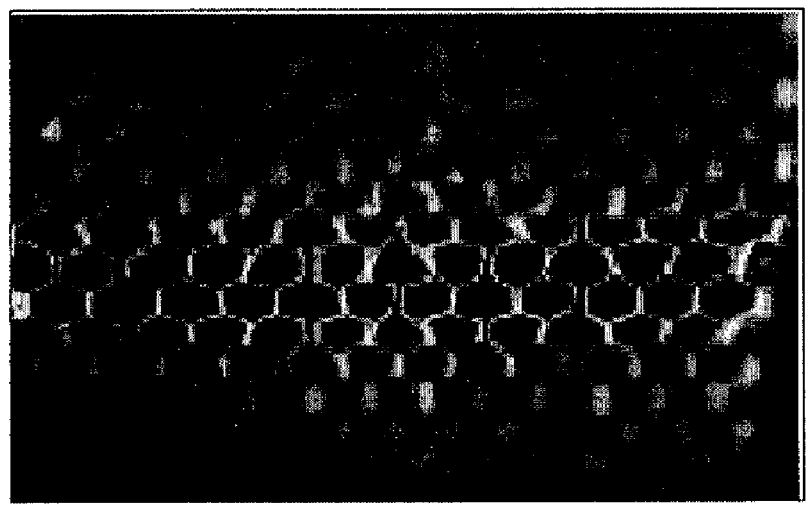
FIG. 5 illustrates one type of honeycomb stiffener material suitable for use in accordance with an embodiment of the invention.

FIG. 5 illustrates an exemplary honeycomb material that may be used as the stiffener material 108. This may include, for example, a honeycomb mesh such as available from Hexcel Corporation. The honeycomb mesh may be bonded to the substrate through a suitable adhesive, such as Sylgard®, for example. Alternatively, the honeycomb material may be a reaction injection molded (RIM) polyurethane foam material, with a fiber or nanoparticle filler material. Still another exemplary material for the honeycomb stiffener is a metal mesh using a thermoset type adhesive.

Figure 6:
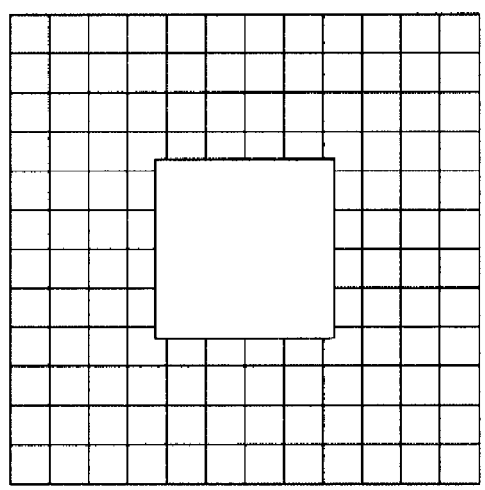
FIGS. 6 through 8 illustrate various exemplary arrangements of the honeycomb cells of the stiffener material.
Figure 7:
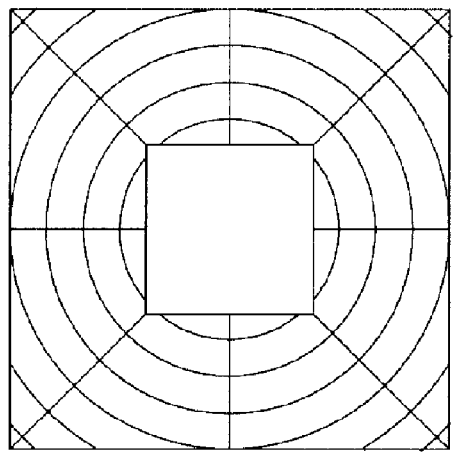
Figure 8:
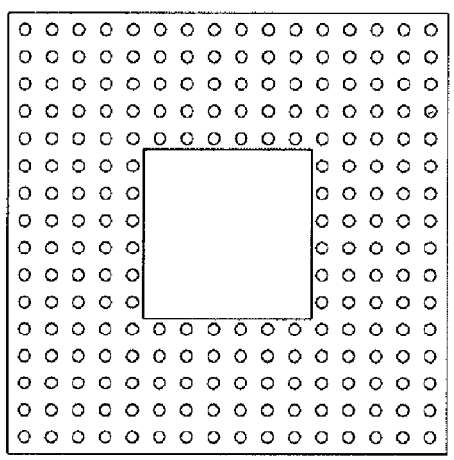

In addition to the better-known hexagonal configuration, other cell shapes are also contemplated, such as depicted in FIGS. 6 through 8. For example, in FIG. 6, the honeycomb cells for the stiffener 108 may be rectangular in shape or, as shown in FIG. 7, may be circumferential in shape. The relative size of the individual cells may further be adapted, with respect to the overall dimensions of the stiffener, to provide the desired stiffness and compliance properties. For example, the cell openings of the honeycomb structure in FIG. 8 are relatively smaller, resembling a "post" configuration.

Figure 9:
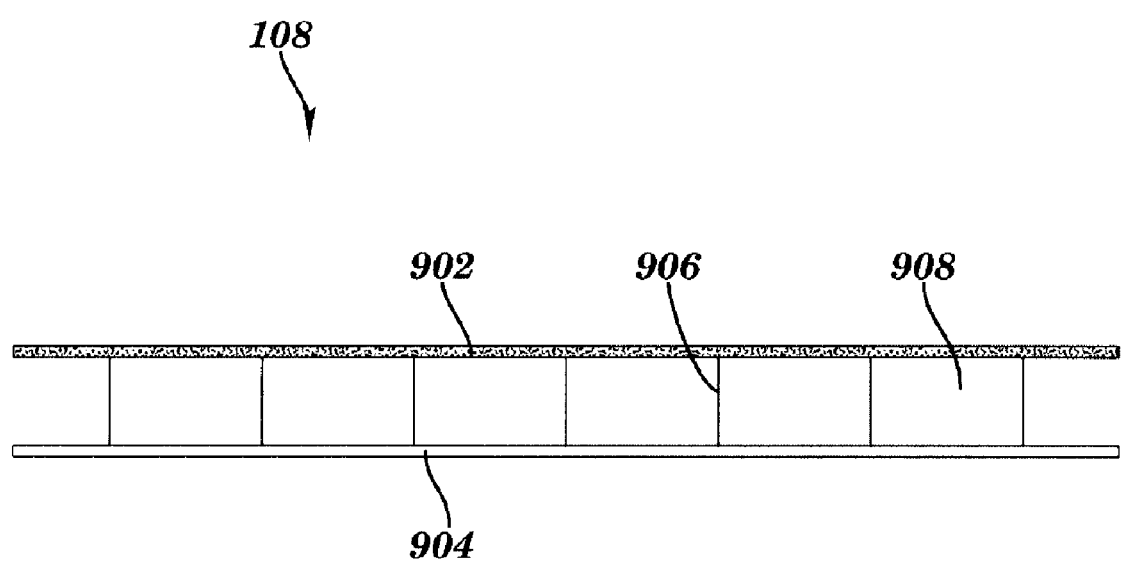
FIG. 9 is a cross-sectional view of an exemplary honeycomb stiffener material, particularly illustrating the different types of materials that may be used within the stiffener.

Because honeycomb is itself an engineered material, it may have specifically tailored properties by varying the materials, skin thicknesses, cell wall thicknesses, and shape. For example, in the cross sectional view of the honeycomb stiffener 108 shown in FIG. 9, a first material may be used for the upper surface 902 of the stiffener (e.g., for attachment to the lid 110 in FIGS. 3 and 4), while a second material may be used for the lower surface 904 of the stiffener 108 (e.g., for attachment to the substrate 104 in FIGS. 1 through 4). Furthermore, a third material may be used for the vertical walls 906 of the individual honeycomb cells 908. In addition, the cellular structure of honeycomb allows for filling of the cells 908 with other materials (besides air), such as liquids or solids that are specifically selected to meet particular thermal, electrical and/or structural needs. This in turn allows for a wider choice of material available for the substrates and lids.

Figure 10:
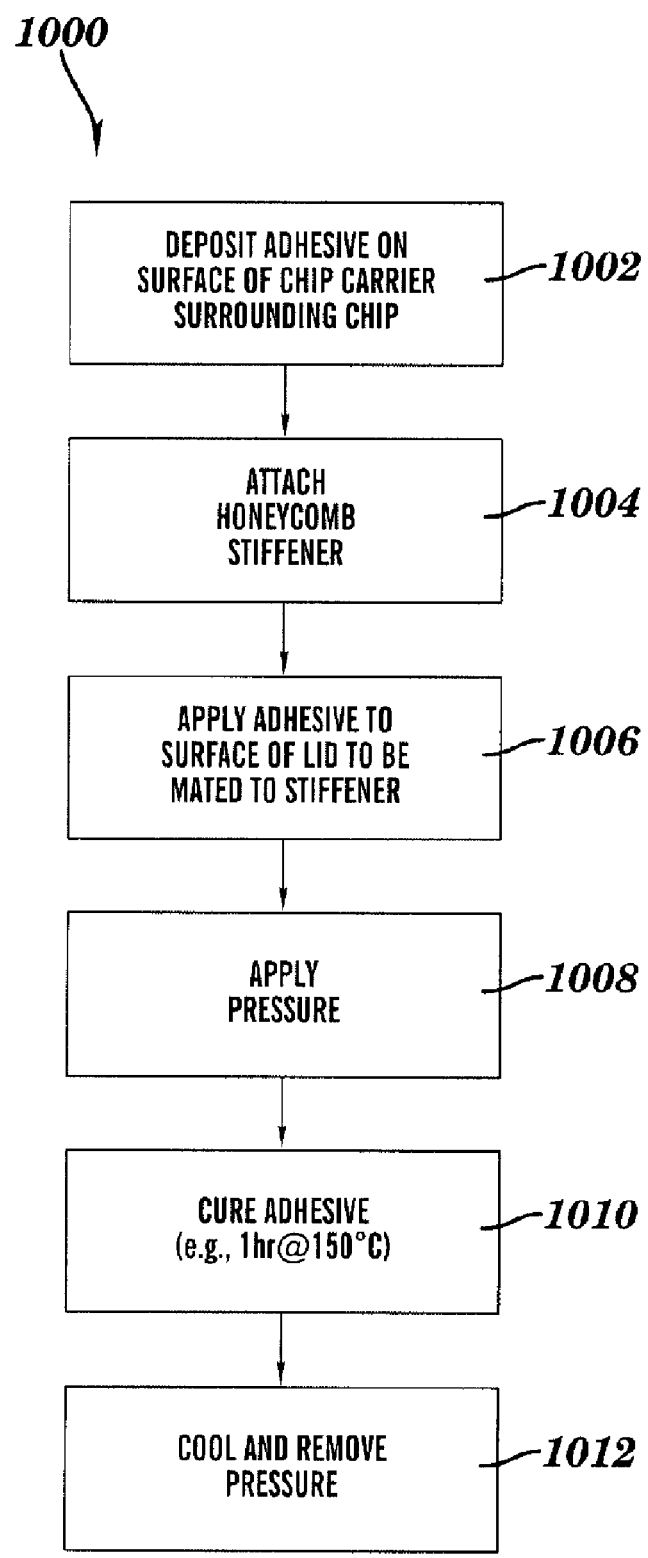
FIG. 10 is a process flow diagram illustrating a method for implementing a mechanical coupling of organic land grid array (LGA) applications, in accordance with a further embodiment of the invention.

Finally, FIG. 10 is a process flow diagram illustrating a method 1000 for implementing a mechanical coupling of organic land grid array (LGA) applications, in accordance with a further embodiment of the invention. As shown in block 1002, an adhesive material is deposited on the surface of a chip carrier (e.g., substrate 104) around the perimeter regions of one or more chips attached to the chip carrier. Although for the structural depictions discussed earlier a single chip attachment is illustrated, it will be appreciated that the honeycomb material may be formed in one or more sections to surround as many chips as desired on a given substrate. Then, in block 1004, the honeycomb stiffener material is attached to the chip carrier (such as depicted in FIG. 2, for example).

Proceeding to block 1006, an adhesive material is applied to the surface of a lid to be attached to the top surface of the honeycomb stiffener and the one or more chips on the chip carrier. The specific adhesive may either be the same or a different type of adhesive than applied to the substrate. As shown in block 1008, pressure is applied in order to provide intimate contact between the honeycomb stiffener and the adjacent surfaces. The adhesive is then cured (e.g., for about 1 hour at about 150° C.), as shown in block 1010. Then, as shown in block 1012, the assembly is cooled and the pressure is removed. Thus configured, the lid as attached to the honeycomb material and one or more chips may be further assembled into an LGA application, even where the substrate to which the chip(s) are attached is made from an organic carrier.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:
1. A land grid array (LGA) assembly, comprising:
a chip carrier substrate having at least one chip attached thereto;
a stiffener member attached to said chip carrier substrate, said stiffener member further comprising a honeycomb material; and a cap attached to said at least one chip and said stiffener member.

2. The LGA assembly of claim 1, wherein said chip carrier substrate comprises an organic material.

3. The LGA assembly of claim 2, further comprising:
a circuit card to which said carrier substrate is mounted through a land grid array;
a backplate supporting said circuit card; and
engagement posts configured to provide a loading force on the assembly.

4. The LGA assembly of claim 1, wherein said stiffener member is characterized by a high stiffness in a z-direction with respect to a plane defined by said carrier substrate, and is compliant in the direction of said plane defined by said carrier substrate.

5. The LGA assembly of claim 1, wherein said stiffener member is disposed around a perimeter of said at least one chip.

6. The LGA assembly of claim 1, wherein said honeycomb material comprises a mesh material.

7. The LGA assembly of claim 1, wherein said honeycomb material comprises a reaction injection molded (RIM) polyurethane foam material.

8. The LGA assembly of claim 7, wherein individual cells of said honeycomb material are filled with at least one of: a fiber and a nanoparticle filler.

9. The LGA assembly of claim 1, wherein said honeycomb material further comprises:
a first material selected for an upper surface thereof, said first material in contact with said cap;
a second material selected for vertical walls of individual cells thereof; and
a third material selected for a lower surface thereof, said third material in contact with said chip carrier substrate.

10. A method for assembling a land grid array (LGA) module, the method comprising:
applying a first adhesive material to a chip carrier substrate having at least one chip attached thereto;
attaching a stiffener member attached to said chip carrier substrate, said stiffener member further comprising a honeycomb material;
applying a second adhesive material to a cap, and compressively attaching said cap to said at least one chip and said stiffener member.

11. The method of claim 10, further comprising applying pressure to the LGA module and curing said adhesive materials.

12. The method of claim 10, wherein said chip carrier substrate comprises an organic material.

13. The method of claim 10, wherein said stiffener member is disposed around a perimeter of said at least one chip.

14. The method of claim 10, wherein said stiffener member is characterized by a high stiffness in a z-direction with respect to a plane defined by said carrier substrate, and is compliant in the direction of said plane defined by said carrier substrate.

15. The method of claim 10, further comprising:
mounting a circuit card to said carrier substrate through a land grid array, said circuit card supported by a backplate; and
configuring engagement posts to provide a loading force on the assembly.

16. The method of claim 10, wherein said honeycomb material comprises a mesh material.

17. The method of claim 10, wherein said honeycomb material comprises a reaction injection molded (RIM) polyurethane foam material.

18. The method of claim 17, wherein individual cells of said honeycomb material are filled with at least one of: a fiber and a nanoparticle filler.

19. The method of claim 10, further comprising:
selecting a first material for an upper surface of said honeycomb material, said first material in contact with said cap;
selecting a second material for vertical walls of individual cells of said honeycomb material; and
selecting a third material for a lower surface of said honeycomb material, said third material in contact with said chip carrier substrate.

* * * * *